(12) United States Patent
Lundqvist

(10) Patent No.: US 6,665,457 B2
(45) Date of Patent: Dec. 16, 2003

(54) TUNABLE ELECTRO-ABSORPTION MODULATOR AND TUNABLE LASER

(75) Inventor: Lennart P. O. Lundqvist, Kista (SE)

(73) Assignee: Altitun AB, Jarfalla (SE)

( * ) Notice: Subject to any disclaimer, the term of this patent is extended or adjusted under 35 U.S.C. 154(b) by 88 days.

(21) Appl. No.: 09/949,597

(22) Filed: Sep. 10, 2001

(65) Prior Publication Data

US 2003/0048976 A1 Mar. 13, 2003

(51) Int. Cl.[7] .................................................. G02B 6/12
(52) U.S. Cl. .......................................... 385/14; 359/154
(58) Field of Search ............................ 385/14; 359/154

(56) References Cited

U.S. PATENT DOCUMENTS

| | | | |
|---|---|---|---|
| 5,825,525 A | 10/1998 | Harwit | 359/248 |
| 5,909,297 A * | 6/1999 | Ishikawa et al. | 359/161 |
| 5,999,298 A | 12/1999 | Ishizaka | 359/154 |
| 6,008,926 A | 12/1999 | Moodie et al. | 359/238 |
| 6,081,361 A | 6/2000 | Adams et al. | 359/188 |
| 6,226,424 B1 * | 5/2001 | Ball et al. | 385/14 |
| 2003/0025976 A1 * | 2/2003 | Wipiejewski | 359/240 |
| 2003/0043448 A1 * | 3/2003 | Bond et al. | 359/248 |

* cited by examiner

Primary Examiner—Michael C. Zarroli
(74) Attorney, Agent, or Firm—Altera Law Group, LLC

(57) ABSTRACT

An electro-absorption modulator is tunable along with the laser. Tuning the electro-absorption modulator permits optimum detuning to be maintained, even though the laser is tuned over several tens of nm. One approach to tuning the electro-absorption modulator is to heat the electro-absorption modulator. A semiconductor laser device includes a semiconductor laser positioned on a substrate. The semiconductor laser produces output light that is tunable over a tuning range between a first wavelength and a second wavelength. An electro-absorption modulator is disposed to modulate the light produced by the semiconductor laser. The operating temperature of the electro-absorption modulator is tunable so as to maintain constant detuning over at least a portion of the tuning range.

50 Claims, 4 Drawing Sheets

TUNABLE ELECTRO-ABSORPTION MODULATOR AND TUNABLE LASER

FIELD OF THE INVENTION

The present invention is directed to a method an apparatus for modulating light, and more particularly to an integrated modulator for modulating laser light that is effective over a wide wavelength range.

BACKGROUND

Optical communications systems are typically based on light that is generated continuously from a laser, where the light is modulated in an external modulator. The external modulator may be, for example, a Mach Zehnder modulator formed on lithium niobate substrate, having an input waveguide coupled to the output form the laser. For ease of fabrication, however, it is preferred to integrate the modulator on the same chip as the laser, in which case the modulator is formed from a semiconductor material.

One form of readily integrable modulator is the electro-absorption modulator. An electro-absorption modulator may be formed in the waveguide that receives the output light from the laser, although it may also be formed as a separate component. An electro-absorption modulator uses a semiconductor material whose band gap, under normal conditions, is larger than the energy of the photons emitted by the laser. Therefore, the light output from the laser is transmitted through the modulator. When the modulator material is subjected to an electric field, however, the band gap reduces due to an electro-optic effect. When the modulator waveguide material includes bulk semiconductor materials, band gap reduces due to the Franz-Keldysh effect. When the modulator includes one or more semiconductor quantum wells, the band gap reduces as a result of the Stark effect.

If the band gap reduces by a sufficient amount, the band gap may become equal to or less than the photon energy of the light output from the laser, in which case the laser light is absorbed in the modulator. Therefore, application of a modulating voltage to the electro-absorption modulator results in a corresponding modulation in the light emitted from the modulator. The electro-absorption modulator is often fabricated in the form of a reverse-biased diode. The electro-absorption modulator has advantages over a Mach-Zehnder modulator formed in semiconducting material because the insertion loss of the electro-absorption modulator is lower and the electro-absorption modulator is typically shorter than a Mach-Zehnder modulator by about a factor of ten. Furthermore, the drive voltage for an electro-absorption modulator is typically around two volts, while a Mach Zehnder formed in semiconducting material may require ten volts.

In considering the design of an electro-absorption modulator, it is advantageous that signal absorption in the modulator is minimal when the modulator is in the transmissive state and that signal absorption is close to 100% when the modulator is in the absorptive state. Therefore, the band gap of the unexcited modulator material is preferably significantly higher than the energy of the laser photons so that transmission in the transmissive state is as high as possible.

On the other hand, the band gap of the unexcited modulator should not be too much greater than the photon energy. The band gap varies approximately linearly with electric field applied across the modulator. Consequently, in order to maintain constant extinction ratio, an increasingly large voltage has to be applied to the electro-absorption modulator when the band gap of the unexcited modulator material is significantly larger than the laser photon energy. The requirement of large modulation voltage reduces the bandwidth of the modulator. If the applied voltage is not increased, then the extinction ratio of the modulator may be reduced. Large modulation voltages are not desirable, since the drive electronics become more complex and consume more power, and the modulator itself suffers from increased heating.

The task of the designer, therefore, is to select a material for the electro-absorption modulator whose band gap is not so small as to produce significant transmission-state losses, nor so large as to require a large drive voltage. It has been found that a satisfactory compromise in band gap energy is that the unexcited semiconductor material has a band gap that differs in energy from the laser output by approximately 0.033 eV. This difference between modulator band gap and the laser photon energy is referred to as detuning. For optical communications lasers operating at about 1550 nm, the detuning corresponds to a wavelength difference of approximately 65 nm.

SUMMARY OF THE INVENTION

There are difficulties, however, when the output wavelength of the laser is tunable. For example, distributed Bragg reflector (DBR) lasers are typically tunable over a range of about 10 nm, and grating coupled, sampled reflector (GCSR) lasers are tunable over several tens of nm. Tuning such lasers moves the laser out of the optimum regime for operating the electro-absorption modulator. If tuned sufficiently far, the laser may tune into a region where the modulator absorbs the output even without an applied electric field, thus reducing the extinction ratio. Furthermore, the laser may tune into a region where the applied voltage required for a particular level of attenuation is significantly higher than at other wavelengths. In general, it is more difficult to produce higher drive voltages at high modulation frequencies, and so tuning the laser may result in reduced modulation bandwidth for the new wavelength. Alternatively, if the voltage is kept constant, the absorption of the light in the modulator under applied voltage may be incomplete, thus reducing extinction ratio.

There is, therefore, a need to reduce or avoid the deleterious effects of tuning the laser away from optimum detuning with the electro-absorption modulator. Furthermore, it is desirable that the modulation voltage applied to the electro-absorption modulator to achieve a selected extinction ratio be constant, regardless of wavelength.

Generally, the present invention relates to an electro-absorption modulator that is tunable along with the laser. Tuning the electro-absorption modulator permits optimum detuning to be maintained, even though the laser is tuned over several tens of nm. One approach to tuning the electro-absorption modulator is to heat the electro-absorption modulator.

One particular embodiment of the invention is directed to a semiconductor laser device that has a substrate and a semiconductor laser positioned on the substrate. The semiconductor laser produces output light that is tunable over a tuning range between a first wavelength and a second wavelength. An electro-absorption modulator is disposed to modulate the light produced by the semiconductor laser. The operating temperature of the electro-absorption modulator is tunable so as to maintain constant detuning over at least a portion of the tuning range.

Another embodiment of the invention is directed to an optical communications system that includes an optical transmitter, and optical receiver and an optical communication link coupled between the optical transmitter and the optical receiver. The optical transmitter has at least one laser operable at a plurality of wavelengths. The laser includes a substrate and a semiconductor laser positioned on the substrate and producing output light tunable over a tuning range between a first wavelength and a second wavelength. The laser also includes an electro-absorption modulator disposed to modulate the output light produced by the semiconductor laser, an operating temperature of the electro-absorption modulator being tunable to maintain constant detuning over at least a portion of the tuning range.

Another embodiment of the invention is directed to a method of operating a semiconductor laser modulated by an electro-absorption modulator. The method includes tuning output light from the semiconductor laser to a desired wavelength between first and second wavelengths and directing the output light through an electro-absorption modulator. The method also includes adjusting an operating temperature of the electro-absorption modulator so as to achieve a preselected extinction level in the electro-absorption modulator.

Another embodiment of the invention is directed to a laser device that includes means for tuning output light from the semiconductor laser to a desired wavelength between first and second wavelengths and means for directing the output light through an electro-absorption modulator. The laser device also includes means for adjusting an operating temperature of the electro-absorption modulator so as to achieve a preselected extinction level in the electro-absorption modulator.

Another embodiment of the invention is directed to a modulator that has a waveguide positioned on a substrate, the waveguide passing through an electro-absorption modulator disposed on the substrate. A heater is disposed on the substrate proximate the electro-absorption modulator.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
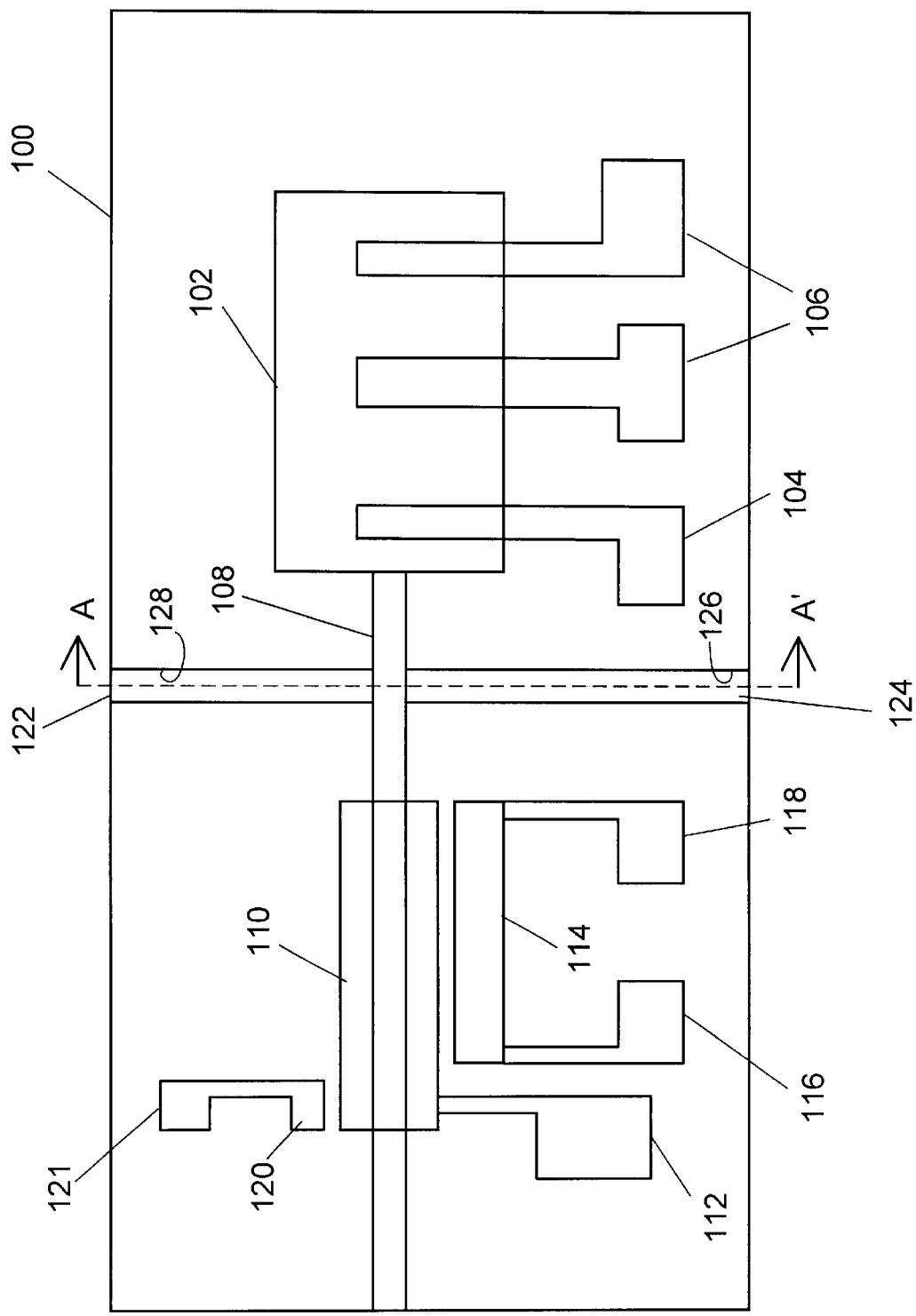
FIG. 1 schematically illustrates a semiconductor laser integrated with an electro-absorption modulator according to the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to electro-absorption modulators that are required to modulate light at different wavelengths, and is believed to be particularly suited to modulating the output of a tunable laser.

One particular embodiment of the invention is shown in schematic form in FIG. 1. A laser 102 is positioned on a chip substrate 100. The laser typically includes at least one bonding pad 104 for the drive current and may include other bonding pads 106 that connect to different wavelength control regions of the laser 102. The laser 102 may be any type of tunable diode laser, for example a distributed Bragg reflector (DBR) laser, a grating coupled, sampled Bragg reflector (GCSR) laser. The laser may also be a dual sampled DBR laser with vernier gratings, for example as is taught in U.S. Pat. No. 4,896,325. Typically, a tunable diode laser includes an active section, where a drive current produces optical gain, and a tuning section where one or more tuning currents control the operating wavelength of the device.

The light output from the laser 102 propagates along a waveguide 108 through an electro-absorption modulator 110. The waveguide may be integrated with the laser 102. The electro-absorption modulator 110 is typically provided with at least one bond pad 112 for connecting to a modulation voltage source.

A heater 114 may be disposed on the substrate 100 close to the electro-absorption modulator 110. The heater 114 may be of any suitable type. In the particular embodiment illustrated, the heater 114 is a thin film resistor. One advantage of providing the heater 114 as a thin film resistor is that little extra wafer processing is required, since a suitable resistor material, namely the electrically conductive material used to form the bond pads, is already part of the wafer fabrication process.

The heater 114 may be connected to one or more bond pads 116 and 118 for connecting to a source for the heating current. The heating current may be a dc current or an ac current. The heater may previously have been calibrated so that the user knows the operating temperature of the electro-absorption modulator 110 for a given heating current and substrate temperature. A temperature sensor 120 may optionally be placed close to the electro-absorption modulator 110 to measure the temperature of the material close to the modulator 110, and thus derive an estimate of the modulator temperature. The temperature sensor 120 may be connected to a bond pad 121 for coupling to external electronics.

The operating temperature of the electro-absorption modulator 110 may be used to control the band gap of the material that forms the electro-absorption modulator 110. The heater current may be changed at the same time that the laser 102 is tuned from one wavelength to another, so as to change the modulator band gap along with the laser's operating wavelength.

Figure 2:
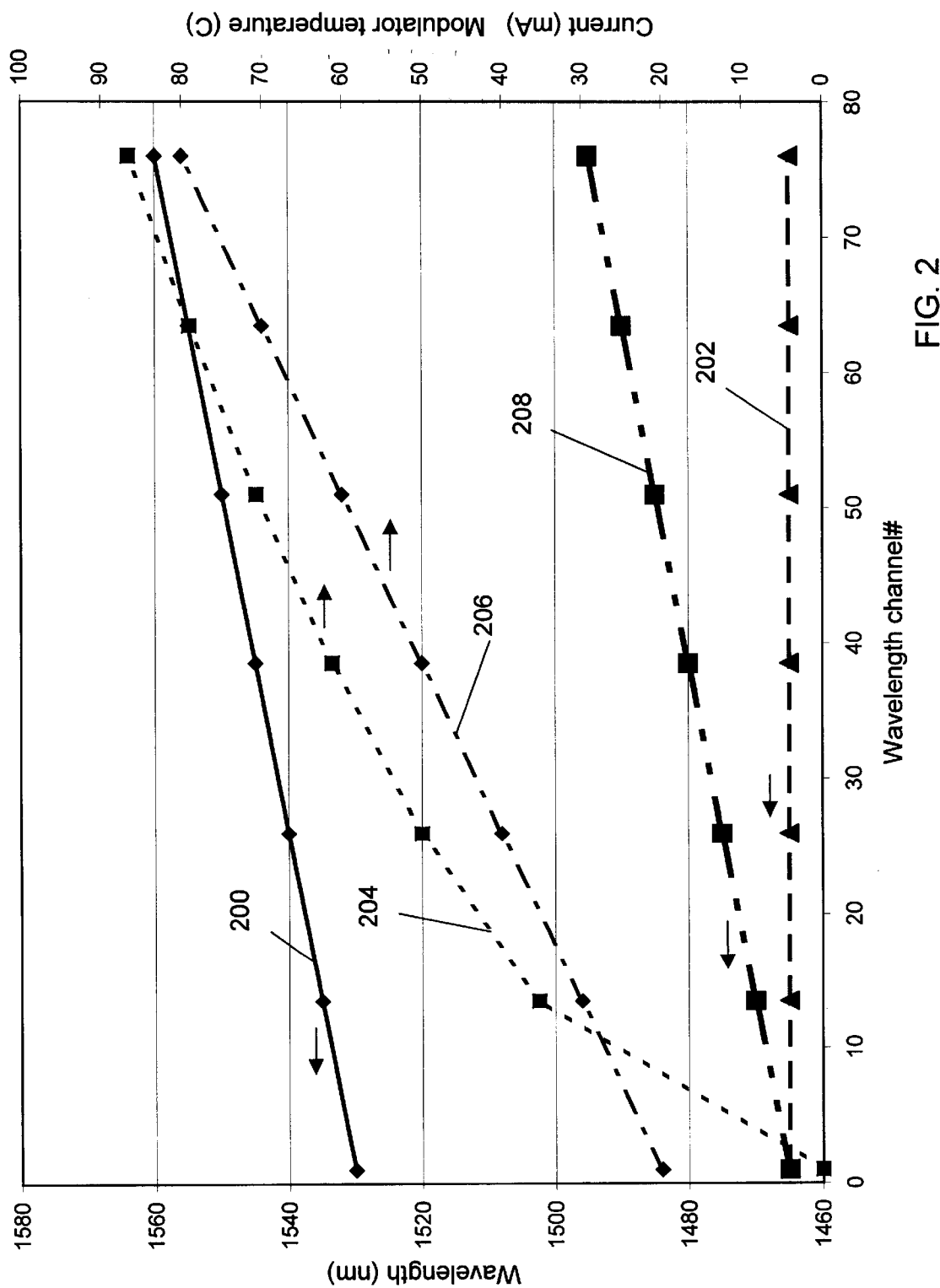
FIG. 2 presents a graph showing various characteristics of the laser module according to the present invention.

The graph illustrated in FIG. 2 shows several characteristics of the laser/electro-absorption modulator combination. All curves are shown plotted against channel number. The left hand axis shows wavelength in nm. The right hand axis shows two parameters, namely current in mA and modulator temperature in ° C. The first curve, curve 200, shows the laser wavelength as a function of channel number. There is a one-to-one mapping of channel number to wavelength. The channel numbers may represent optical channels having frequencies set according to the International Telecommunications Union (ITU) standards.

The second curve, curve 202, illustrates the wavelength that corresponds to the modulator band gap under no heating. As can be seen, the difference between this curve 202 and the laser wavelength, curve 200, increases with increasing channel number. In other words, the detuning varies as a function of laser operating wavelength.

The third curve 204 shows the heater current as a function of channel number. The heater current is assumed for a 100 Ω heater at 80 W/K. The fourth curve 206 shows the modulator temperature that results from heating. The fifth curve 208 shows the wavelength that corresponds to the modulator band gap with the heater operating. For InP-based semiconductors, the wavelength change with temperature is approximately 0.5–0.6 nm/K. For the case illustrated, the modulator band gap wavelength increases with channel number at approximately the same rate as the laser wavelength illustrated in curve 200. Therefore, the variation in the detuning, in other words the difference between curves 200 and 208, over a large number of channels is reduced relative to the variation in detuning when the heater is not used to heat the electro-absorption modulator, i.e. between curves 200 and 202. With judicious control of the heater current, the detuning may be kept approximately constant across a large number of channels, if not the entire tuning range.

Heating the electro-absorption modulator should advantageously not affect the operation of the laser 102. In particular, the heat provided to the electro-absorption modulator 110 by the heater 114 may affect, for example, the operating temperature of the laser 102. It is generally preferred that the operating wavelength of the laser 102 be tunable independent of the operating temperature of the electro-absorption modulator 110.

Figure 3:
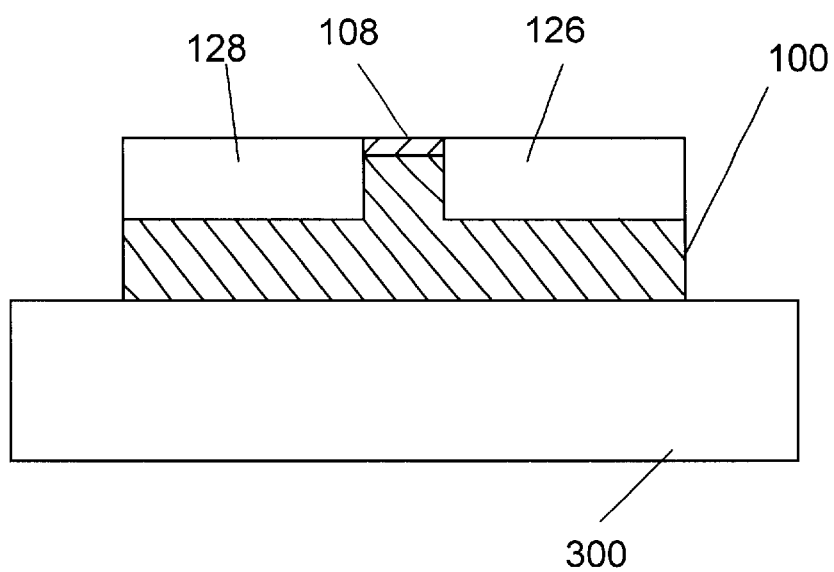
FIG. 3 illustrates the cross-sectional view AA' of the device in FIG. 1 mounted on a heatsink according to the present invention.

One approach to reducing heat flow from the heater 114 to the laser 102 is to insert thermal resistance to the heat conduction path between the heater 114 and the laser 102, is described with reference to FIGS. 1 and 3. In the particular embodiment illustrated, one or more slots 122 and 124 are cut into the substrate 100. The side faces of the slots 122 and 124 are referred to as faces and 128. The slot faces 126 and 128 may be seen more clearly in FIG. 3 which shows section AA'. The slots 122 and 124 increase the length of the path that heat has to travel between the heater 114 and the laser 102, thus reducing adverse heating effects on the laser 102 that arise due to the heater 114.

Where the band gap wavelength tunes at a rate of 0.5–0.6 nm/K, the band gap is tuned over a range of about 20–24 nm by raising the temperature of the modulator by 40 K. Without taking any precautions, some heat may be transferred from the temperature-tuned modulator to the laser, which might result in affecting the operating wavelength of the laser, for example by changing the effective optical length of the laser cavity, thus tuning the Fabry/Perot mode or modes. This need not be a significant problem if the period over which the wavelength of the laser and electro-absorption modulator are tuned is in the microsecond range or longer. Furthermore, the laser 102 may include a phase control section that may be adjusted to compensate for any increase in temperature of the laser 102 that occurs due to the modulator heater 114.

The substrate 100 may be mounted on a heatsink 300 which removes heat from the substrate 100. The heatsink 300 may be formed from any suitable material, including ceramics such as aluminum nitride, beryllia, or alumina, metals such as copper or titanium/tungsten, or semiconductor materials such as silicon.

The effect of temperature tuning the electro-absorption modulator on the laser may be reduced by increasing the thermal resistance between the modulator and the laser and by making the modulator easy to heat. For example, the modulator may be made to be have as low a thermal mass as possible, and should be placed very close to the modulator.

Figure 4:
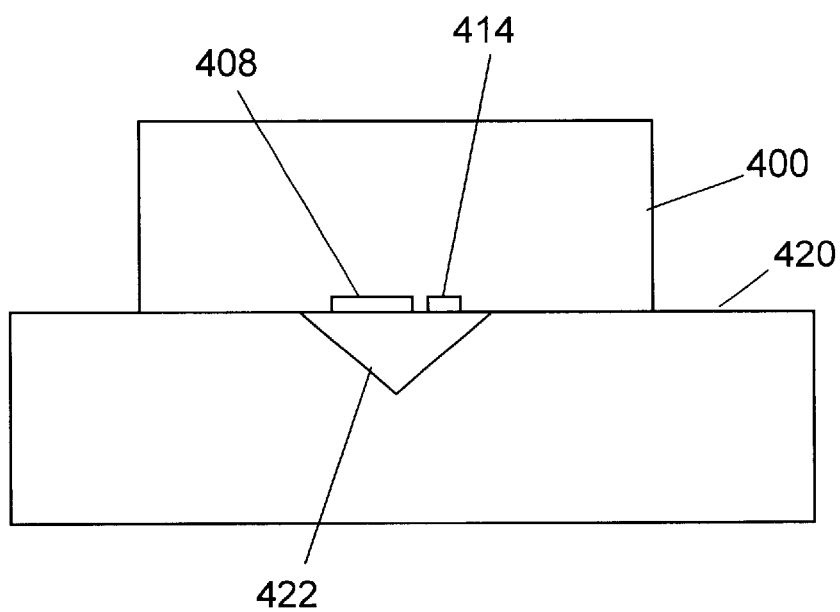
FIG. 4 illustrates another embodiment of mounting a laser module of the present invention on a heatsink.

Another approach to preventing the heater from affecting the operation of the laser is illustrated in FIG. 4. In this case, a cross-section through the substrate 400 is given, showing the electro-absorption modulator 408 and the heater 414 on the bottom surface of the substrate. This configuration is commonly referred to as "p-side down", since the p-doped layer of the laser is mounted on the heatsink 420. The substrate 420 may be provided with a groove 422. The groove 422 may be sufficiently large so as to provide clearance for contacts to the individual components on the ship substrate 400.

One of the advantages of the p-side down configuration is that the heat generated at the laser and at the heater does not have to pass through the substrate to be extracted. Another advantage is that the thermal path length between the heater 414 and the heatsink 420 may be made to be very short, thus significantly reducing the amount of heat that is conducted over the longer path length to the laser. An advantage provided by using the groove 422 is that a fiber may conveniently be positioned in the groove 422 for coupling to the waveguide 408 to receive the modulated output light from the chip 100.

Figure 5:
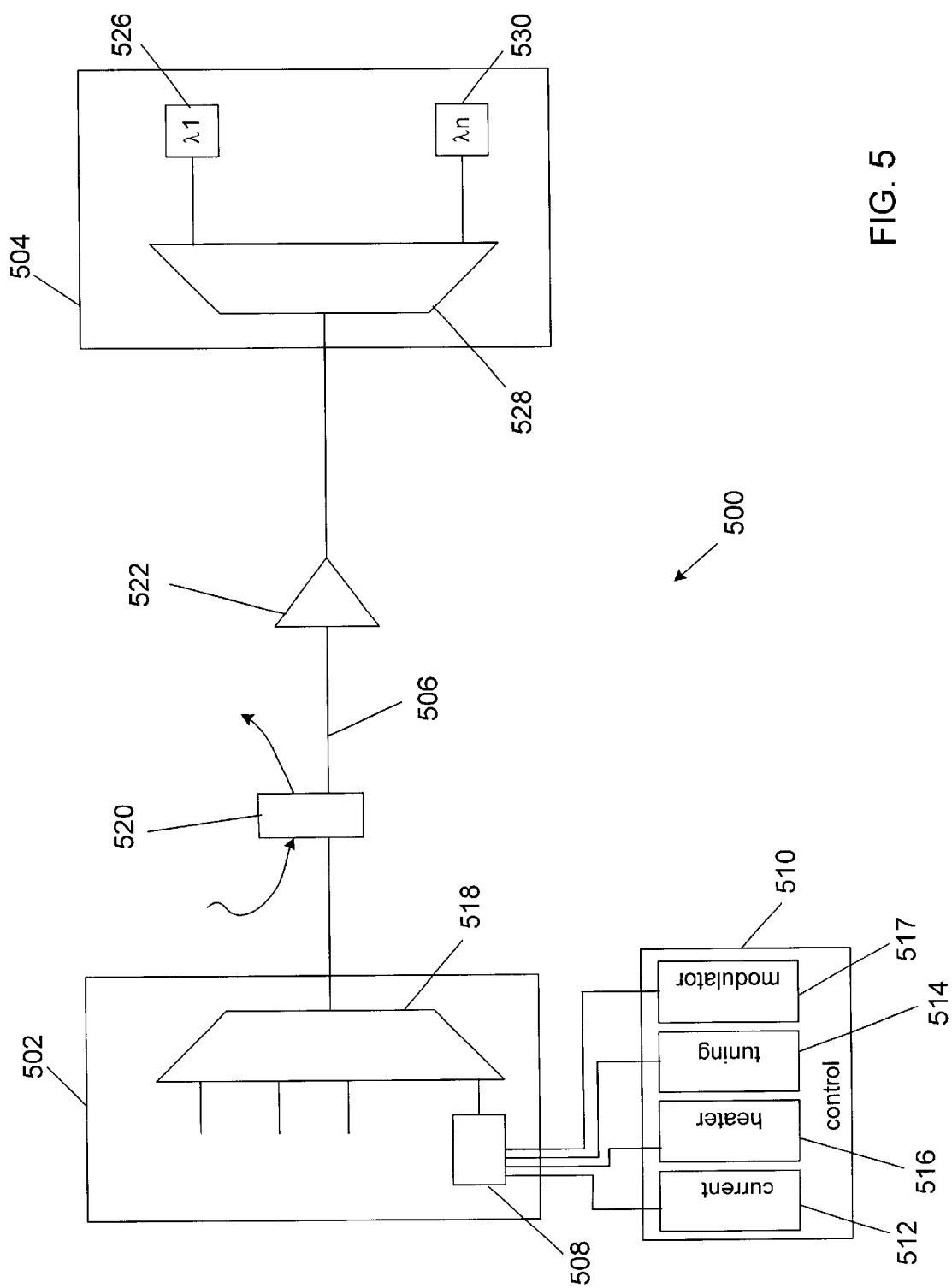
FIG. 5 schematically illustrates an optical communications system that incorporates a tunable electro-absorption modulator according to the present invention.

One particular embodiment of a communications system that utilizes a laser having an integrated electro-absorption modulator is illustrated in FIG. 5. The communications system 500 includes a transmitter 502 and a receiver 504 coupled through a fiber communications link. 506. The transmitter 502 includes a laser module 508. The laser module 508 includes a laser and an electro-absorption modulator. A controller 510 is connected to the laser module 508 to control operation of the laser. The controller 510 may include a current control unit 512 to control the drive current to the laser, and a tuning control unit 514 to control the wavelength emitted by the laser. The controller 510 may also include a heater control unit 516 that controls the temperature of the heater, thus controlling the band gap of the electro-absorption modulator. The heater control 516 may typically be operated in tandem with the tuning control unit 514, so that the band gap of the electro-absorption modulator is adjusted when the operating wavelength of the laser is tuned, so as to maintain optimum, or near optimum, detuning. A modulator controller 517 may be coupled to provide a modulation signal to the electro-absorption modulator.

Where the transmitter 502 includes more than one light source, the output from the laser module 508 is combined with the output from the other sources (not shown) in a combiner 518. The combiner 518 may be a wavelength division multiplexer (WDM), a polarization division multiplexer, or any other suitable type of combiner.

The output from the laser module 508, combined with the output from any other light source in the transmitter 502, propagates along the fiber link 506 to the receiver 504. The fiber link 506 may include various switching elements, such as one or more add/drop filters 520, and one or more amplifiers 522.

The signal is detected in the receiver by at least one detector 526. Where more than one detector is used in the receiver 504, the signal may pass into a demultiplexer (DMUX) 528 where it is split into respective wavelength components and directed to different detectors 526, 530 corresponding to the different components.

As noted above, the present invention is applicable to electro-absorption modulators and is believed to be particularly useful for electro-absorption modulators used in conjunction with tunable lasers. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

For example, the tunable electro-absorption modulator need not be integrated with a laser, but may be integrated with other components, or may be an independent component. It will be appreciated that the electro-absorption modulator is formed from semiconductor material that is useful for the desired wavelength range. For example, where the electro-absorption modulator is used for modulating an optical communications signal in the range 1500 nm–1650 nm, the electro-absorption modulator may be formed from an InP-based semiconductor. A tunable electro-absorption modulator may be formed from other suitable types of semiconductor material for operating at different wavelength ranges. For example, for operation in the range 800–900 nm, the electro-absorption modulator may be formed from a GaAs-based semiconductor material. Furthermore, the electro-absorption modulator may be based on bulk semiconductor material or may be based on the use of one or more quantum wells.

I claim:

1. A semiconductor laser device comprising:
   a substrate;
   a semiconductor laser positioned on the substrate and producing output light tunable over a tuning range between a first wavelength and a second wavelength;
   an electro-absorption modulator disposed to modulate the output light produced by the semiconductor laser, an operating temperature of the electro-absorption modulator being tunable to maintain constant detuning over at least a portion of the tuning range; and
   a thermal resistor positioned between the electro-absorption modulator and an output end of the semiconductor laser so as to reduce conductive transfer of heat energy between the electro-absorption modulator and the semiconductor laser.

2. A laser device as recited in claim 1, wherein the electro-absorption modulator is integrated on the substrate with the semiconductor laser.

3. A laser device as recited in claim 1, wherein the laser is tunable independent of a drive current passing through the laser.

4. A laser device as recited in claim 1, wherein the detuning is approximately constant between the first and second wavelengths.

5. A laser device as recited in claim 1, further comprising a heater disposed proximate the electro-absorption modulator to heat the electro-absorption modulator.

6. A laser device as recited in claim 1, wherein voltage applied to the electro-absorption modulator is substantially independent of operating wavelength.

7. A laser device as recited in claim 1, further comprising a waveguide coupled between an output end of the semiconductor laser and an input to the electro-absorption modulator.

8. A laser device as recited in claim 1, wherein the thermal resistor includes at least one slot cut into the substrate on a side of the waveguide, the slot being disposed between the electro-absorption modulator and the semiconductor laser so as to increase a thermal path length between the electro-absorption modulator and the semiconductor laser.

9. A laser device as recited in claim 8, wherein the at least one slot extends into the substrate below a depth of the waveguide.

10. A laser device as recited in claim 1, wherein the first and second wavelengths each lie in the range between 1500 nm and 1650 nm.

11. A laser device as recited in claim 1, further comprising a drive controller coupled to provide a drive current to the semiconductor laser and a modulator controller coupled to provide a modulating voltage to the electro-absorption modulator.

12. A laser device as recited in claim 11, further comprising a temperature controller coupled to control the temperature of the electro-absorption modulator.

13. A laser device as recited in claim 12, further comprising a heater disposed proximate the electro-absorption modulator and the temperature controller includes a heater controller coupled to control a temperature of the heater.

14. A laser device as recited in claim 1, further comprising a heatsink, the substrate being mounted on the heatsink.

15. A laser device as recited in claim 14, wherein a side of the substrate containing the laser is mounted to a mounting face of the heatsink, the mounting face of the heatsink including a groove, the electro-absorption modulator being disposed above the groove.

16. An optical communications system, comprising:
   an optical transmitter, the optical transmitter including at least one laser operable at a plurality of wavelengths, the laser including
   a substrate;
   a semiconductor laser positioned on the substrate and producing output light tunable over a tuning range between a first wavelength and a second wavelength; and
   an electro-absorption modulator disposed to modulate the output light produced by the semiconductor laser, an operating temperature of the electro-absorption modulator being tunable to maintain approximately constant detuning between the first and second wavelengths;
   an optical receiver; and
   an optical communication link coupled between the optical transmitter and the optical receiver.

17. A system as recited in claim 16, further comprising at least one fiber amplifier disposed along the fiber link between the optical transmitter and the optical receiver.

18. A system as recited in claim 16, further comprising at least one add/drop multiplexer disposed along the fiber link between the optical transmitter and the optical receiver.

19. A system as recited in claim 16, further comprising a heater disposed on the substrate proximate the electro-absorption modulator, and a heater controller coupled to control a temperature of the heater.

20. A system as recited in claim 16, further comprising a drive controller coupled to provide a drive current to the semiconductor laser and a modulator controller coupled to provide a modulating voltage to the electro-absorption modulator.

21. A system as recited in claim 16, further comprising a tuning controller coupled to control an operating wavelength of the laser.

22. A method of operating a semiconductor laser modulated by an electro-absorption modulator, the method comprising:
   tuning output light from the semiconductor laser to a desired wavelength between first and second wavelengths;
   directing the output light through an electro-absorption modulator; and
   adjusting an operating temperature of the electro-absorption modulator so as to achieve a preselected extinction level in the electro-absorption modulator;
   wherein a voltage applied to the modulator to achieve the preselected extinction level when the semiconductor laser is operating at the first wavelength is approximately equal to the applied voltage required to achieve the preselected extinction level when the semiconductor laser is operating at the second wavelength.

23. A method as recited in claim 22, wherein adjusting the operating temperature of the electro-absorption modulator includes adjusting a heater current supplied to a heater positioned proximate the electro-absorption modulator.

24. A method as recited in claim 22, wherein adjusting the operating temperature includes maintaining a substantially constant detuning.

25. A method as recited in claim 22, wherein tuning the output light to a desired wavelength includes maintaining a substantially uniform drive current through the laser.

26. A laser device, comprising:
   means for tuning output light from a semiconductor laser to a desired wavelength between first and second wavelengths;
   means for directing the output light through an electro-absorption modulator; and
   means for adjusting an operating temperature of the electro-absorption modulator so as to achieve a preselected extinction level in the electro-absorption modulator;
   wherein a voltage applied to the modulator to achieve the preselected extinction level when the semiconductor laser is operating at the first wavelength is approximately equal to the applied voltage required to achieve the preselected extinction level when the semiconductor laser is operating at the second wavelength.

27. A semiconductor laser device, comprising:
   a substrate;
   a semiconductor laser positioned on the substrate and producing output light tunable over a tuning range between a first wavelength and a second wavelength;
   an electro-absorption modulator disposed to modulate the output light produced by the semiconductor laser, an operating temperature of the electro-absorption modulator being tunable to maintain constant detuning between the first and second wavelengths; and
   a thermal resistor positioned between the electro-absorption modulator and an output end of the semiconductor laser so as to reduce conductive transfer of heat energy between the electro-absorption modulator and the semiconductor laser.

28. A laser device as recited in claim 27, further comprising a heater disposed proximate the electro-absorption modulator to heat the electro-absorption modulator.

29. A laser device as recited in claim 27, wherein voltage applied to the electro-absorption modulator is substantially independent of operating wavelength.

30. A laser device as recited in claim 27, further comprising a waveguide coupled between an output end of the semiconductor laser and an input to the electro-absorption modulator, the thermal resistor comprising at least one slot cut into the substrate on a side of the waveguide, the slot being disposed between the electro-absorption modulator and the semiconductor laser so as to increase a thermal path length between the electro-absorption modulator and the semiconductor laser.

31. A laser device as recited in claim 27, wherein the at least one slot extends into the substrate below a depth of the waveguide.

32. A laser device as recited in claim 27, further comprising a drive controller coupled to provide a drive current to the semiconductor laser and a modulator controller coupled to provide a modulating voltage to the electro-absorption modulator.

33. A laser device as recited in claim 32, further comprising a temperature controller coupled to control the temperature of the electro-absorption modulator.

34. A laser device as recited in claim 33, further comprising a heater disposed proximate the electro-absorption modulator and the temperature controller includes a heater controller coupled to control a temperature of the heater.

35. A laser device as recited in claim 27, further comprising a heatsink, the substrate being mounted on the heatsink.

36. A laser device as recited in claim 35, wherein a side of the substrate containing the laser is mounted to a mounting face of the heatsink, the mounting face of the heatsink including a groove, the electro-absorption modulator being disposed above the groove.

37. A semiconductor laser device, comprising:
   a substrate;
   a semiconductor laser positioned on the substrate and producing output light tunable over a tuning range between a first wavelength and a second wavelength; and
   an electro-absorption modulator disposed to modulate the output light produced by the semiconductor laser, an operating temperature of the electro-absorption modulator being tunable to maintain constant detuning over at least a portion of the tuning range;
   wherein voltage applied to the electro-absorption modulator is substantially independent of operating wavelength and the detuning is approximately constant between the first and second wavelengths.

38. A laser device as recited in claim 37, further comprising a heater disposed proximate the electro-absorption modulator to heat the electro-absorption modulator.

39. A laser device as recited in claim 37, further comprising a thermal resistor positioned between the electro-absorption modulator and an output end of the semiconductor laser so as to reduce conductive transfer of heat energy between the electro-absorption modulator and the semiconductor laser.

40. A laser device as recited in claim 39, further comprising a waveguide coupled between an output end of the semiconductor laser and an input to the electro-absorption modulator, the thermal resistor comprising at least one slot cut into the substrate on a side of the waveguide, the slot being disposed between the electro-absorption modulator and the semiconductor laser so as to increase a thermal path length between the electro-absorption modulator and the semiconductor laser.

41. A laser device as recited in claim 37, wherein the at least one slot extends into the substrate below a depth of the waveguide.

42. A laser device as recited in claim 37, further comprising a drive controller coupled to provide a drive current to the semiconductor laser and a modulator controller coupled to provide a modulating voltage to the electro-absorption modulator.

43. A laser device as recited in claim 42, further comprising a temperature controller coupled to control the temperature of the electro-absorption modulator.

44. A laser device as recited in claim 43, further comprising a heater disposed proximate the electro-absorption modulator and the temperature controller includes a heater controller coupled to control a temperature of the heater.

45. A laser device as recited in claim 37, further comprising a heatsink, the substrate being mounted on the heatsink.

46. A laser device as recited in claim 45, wherein a side of the substrate containing the laser is mounted to a mounting face of the heatsink, the mounting face of the heatsink including a groove, the electro-absorption modulator being disposed above the groove.

47. A semiconductor laser device, comprising:

a substrate;

a semiconductor laser positioned on the substrate and producing output light tunable over a tuning range between a first wavelength and a second wavelength;

an electro-absorption modulator disposed to modulate the output light produced by the semiconductor laser, an operating temperature of the electro-absorption modulator being tunable to maintain constant detuning over at least a portion of the tuning range; and a heatsink, a side of the substrate containing the laser is mounted to a mounting face of the heatsink, the mounting face of the heatsink including a groove, the electro-absorption modulator being disposed in the groove.

48. A method of operating a semiconductor laser modulated by an electro-absorption modulator, the method comprising, comprising:

tuning output light from the semiconductor laser to a desired wavelength between first and second wavelengths;

directing the output light through an electro-absorption modulator; and adjusting an operating temperature of the electro-absorption modulator so as to achieve a preselected extinction level in the electro-absorption modulator, adjusting the operating temperature including maintaining a substantially constant detuning;

wherein a voltage applied to the modulator to achieve the preselected extinction level when the semiconductor laser is operating at the first wavelength is approximately equal to the applied voltage required to achieve the preselected extinction level when the semiconductor laser is operating at the second wavelength.

49. A method as recited in claim 48, wherein adjusting the operating temperature of the electro-absorption modulator includes adjusting a heater current supplied to a heater positioned proximate the electro-absorption modulator.

50. A method as recited in claim 48, wherein tuning the output light to a desired wavelength includes maintaining a substantially uniform drive current through the laser.

* * * * *